(12) United States Patent
Yao

(10) Patent No.: US 7,589,390 B2
(45) Date of Patent: Sep. 15, 2009

(54) SHIELDED THROUGH-VIA

(75) Inventor: Jun Jason Yao, Thousand Oaks, CA (US)

(73) Assignee: Teledyne Technologies, Incorporated, Thousand Oaks, CA (US)

( * ) Notice: Subject to any disclaimer, the term of this patent is extended or adjusted under 35 U.S.C. 154(b) by 326 days.

(21) Appl. No.: 11/373,223

(22) Filed: Mar. 10, 2006

(65) Prior Publication Data

US 2007/0222021 A1 Sep. 27, 2007

(51) Int. Cl.
*H01L 23/48* (2006.01)

(52) U.S. Cl. .................. 257/503; 257/508; 257/774; 257/E23.174

(58) Field of Classification Search ................ 257/508, 257/774, 503, E23.174
See application file for complete search history.

(56) References Cited

U.S. PATENT DOCUMENTS

| | | | |
|---|---|---|---|
| 4,348,253 A | | 9/1982 | Subbarao et al. |
| 4,445,978 A | | 5/1984 | Whartenby et al. |
| 5,170,081 A | * | 12/1992 | Adachi et al. ............... 327/560 |
| 5,949,030 A | | 9/1999 | Fasano et al. |
| 6,151,967 A | * | 11/2000 | McIntosh et al. ......... 73/514.32 |
| 6,221,769 B1 | | 4/2001 | Dhong et al. |
| 6,589,594 B1 | | 7/2003 | Hembree |
| 6,645,832 B2 | | 11/2003 | Kim et al. |
| 6,661,085 B2 | | 12/2003 | Keller et al. |
| 6,717,071 B2 | | 4/2004 | Chang et al. |
| 6,762,076 B2 | | 7/2004 | Kim et al. |
| 6,821,826 B1 | | 11/2004 | Chan et al. |
| 6,852,627 B2 | | 2/2005 | Sinha et al. |
| 6,852,927 B2 | | 2/2005 | Sinha et al. |
| 2004/0149490 A1 | * | 8/2004 | Chang et al. ............... 174/266 |
| 2004/0188826 A1 | * | 9/2004 | Palanduz et al. ........... 257/700 |
| 2005/0046480 A1 | * | 3/2005 | Dyer et al. ................. 330/258 |

OTHER PUBLICATIONS

Chang et al. "A CMOS Differential Buffer Amplifier with Accurate Gain and Clipping Control." IEEE Journal of Solid-State Circuits, vol. 30, No.7, Jul. 1995, p. 731.*

* cited by examiner

*Primary Examiner*—Minh-Loan T Tran
*Assistant Examiner*—W. Wendy Kuo
(74) *Attorney, Agent, or Firm*—Eric A. Gifford

(57) ABSTRACT

A shielded through-via that reduces the effect of parasitic capacitance between the through-via and surrounding wafer while providing high isolation from neighboring signals. A shield electrode is formed in the insulating region and spaced apart from the through-via. A coupling element couples at least the time-varying portion of the signal carried on the through-via to the shield electrode. This reduces the effect of any parasitic capacitance between the through-via and the shield electrode, hence the surrounding wafer.

22 Claims, 6 Drawing Sheets

SHIELDED THROUGH-VIA

BACKGROUND OF THE INVENTION

1. Field of the Invention

This invention relates to 3D interconnects for wafers, printed circuit boards (PCBs) and other high density circuits and more specifically to a shielded through-via that reduces the effect of parasitic capacitance on a high impedance signal passing through the through-via.

2. Description of the Related Art

Via connectors are widely used in the electronic industry for making electrical connections between the opposite surfaces of electronic devices. For example, in the manufacture of printed circuit board assemblies it is common practice to place discrete electronic components on one surface of a printed circuit board and to form the required connecting circuitry, ground planes, or the like on the opposite surface with the required electrical connections being made through the printed circuit board by using plated through holes or by various other techniques well known to those skilled in the printed circuit board art. Via connectors are also used to make electrical connections between layers of a multi-layer laminate PCB.

In the fabrication of semiconductor devices, it is also often desirable to form solid state electronic components on one surface of the semiconductor wafer and connecting circuitry, ground planes or possibly other solid state electronic components on the opposite surface of the semiconductor wafer and then to provide electrical connections between the elements on the two surfaces. For example, in the manufacture of microwave devices, it is often desirable to form a field effect transistor or a diode on one surface of a semiconductor wafer, a microstrip, heat sink, ground plane, or the like, on the opposite surfaces of the wafer and then to provide the required electrical connection between the surfaces with a via connector. It is also often desirable to form multi-layer metal interconnects in a dielectric thin-film on one side of a substrate to provide electrical connections for the integrated circuitry and to provide the required electrical connection between metal layers with a via connector.

A three-dimensional (3D) wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance.

One major challenge of 3D interconnects on a single wafer or in a wafer-to-wafer vertical stack is the through-via that provides a signal path for high impedance signals to traverse from one side of the wafer to the other. Commonly, holes are formed in the wafer, an oxide layer is deposited in the hole to insulate the through-via from the wafer, and the conductive via is deposited. The signal can be loaded by having to drive the parasitic capacitance formed between the through-via and the surrounding wafer and can be distorted by crosstalk from other signals reflected back onto the through-via through the parasitic capacitance.

U.S. Pat. No. 6,762,076 forms vias for wafer-to-wafer stacking by selectively etching the top wafer to form a via, depositing an oxide layer to insulate a sidewall of the via, forming a barrier/seed layer in the via, depositing a barrier layer in the via, depositing a seed layer on the barrier layer, and depositing a conduction metal on the seed layer in the via for providing an electrical connection between active devices on the vertically stacked wafers and the external interconnect. Vias taper from top to bottom so that a top surface of each via has a larger area in order to vertically stack wafers and connect the vias.

U.S. Pat. No. 5,949,030 forms multiple vias coaxially or in axis parallel alignment in a primary through-hole in a printed circuit board, chip carrier or like electrical device to increase the through via density to increase the I/O capacity of the devices. A primary metallized through hole or via is filled or coated with a dielectric material which is also placed on both surfaces of the device at the ends of the via. The dielectric material inside the via can then be provided with at least one coaxial through-hole or multiple axis parallel through holes which can be metallized to form conductive paths between the surfaces of the device. Portions of the dielectric surface layer can be removed to expose contacts to the inner metallized via. In addition electrical signal paths can be isolated within voltage or ground co-axial conductors.

Signal generating devices such as accelerometers, gyroscopes and pressure sensors can have a total capacitance of <1 pF. At typical frequencies, the signal impedance will be from 10 s of kilo ohms to giga ohms. To detect very small changes in the total capacitance, <1 fF or even <1 aF, the signal can not be loaded by the parasitic capacitance of the wafer structure or crosstalk with other electrical signals as it traverses the through-via. Alternately, a signal generating device such as a CCD camera is characterized by very high impedance (low capacitance) for each imaging pixel where the amount of charge on each pixel is changing. To detect small changes in charge, the signal must again be preserved. Furthermore, loading increases power consumption and heat dissipation. The challenge remains to provide a through-via that reduces and preferably eliminates the effect of parasitic capacitance formed between the through-via and the surrounding wafer and provides high isolation from other signals.

SUMMARY OF THE INVENTION

The present invention provides a shielded through-via that reduces the effect of parasitic capacitance between the through-via and surrounding layer while providing high isolation from neighboring signals. The layer can be a wafer, a dielectric thin film in the multi-layer metal interconnect, a PCB layer, or a PCB layer in a multi-layer PCB structure.

A shield electrode is formed in an insulating region of the layer and spaced apart from the through-via. A coupling element couples at least a time-varying portion of the signal carried on the through-via to the shield electrode. This reduces the effect of any parasitic capacitance between the through-via and the shield electrode, hence the surrounding layer. In conductive or semi-conductive wafers, the shield electrode is also spaced apart from the wafer material. In resistive wafers or insulating layers such as PCBs or a thin-film dielectric, the through-via and shield electrode may be formed directly in the resistive or insulating material.

Ideally the voltage applied to the shield electrode would exactly track at least the time-varying portion of the signal voltage on the through-via. The electric field between the shield electrode and through-via would be held constant and the effect of the parasitic capacitance completely negated. To achieve this result, the coupling element must isolate the signal on the through-via from the signal applied to the shield electrode so that other signals (noise) are not reflected back to the through-via. Isolation can be achieved, for example, electrically, optically or mechanically. The coupling element would have unity gain, an infinite input impedance to avoid loading the signal on the through-via and a zero output impedance to avoid loading the signal coupled to the shield electrode by other signals (noise). Coupling elements such as a buffer, optical isolator or microelectromechanical system (MEMS) isolator can be configured to provide very close to unity gain, input impedances comparable to and preferably larger than the high-impedance signal, e.g. from 10's kilo ohms to giga ohms, and an output impedance less than 10 ohms and typically 0.1 to 1 ohm. A substantial reduction in the effect of the parasitic capacitance can still be realized if one or more of these conditions are not met. An additional benefit of the shielded through-via is that the high-impedance signal is transformed into a low-impedance signal that is less susceptible to parasitic capacitance from neighboring structure or signals as the signal is carried off the layer or to another electrical component.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a shielded through-via that reduces the effect of parasitic capacitance between the through-via and surrounding layer while providing high isolation from neighboring signals. For purposes of illustration the shielded through-via will be described in the context of a semi-conductive wafer but it is understood that the layer can be, for example a wafer (conductive, semi-conductive or resistive), a dielectric thin film in a multi-layer metal interconnect on the surface of a wafer, a PCB layer, or a PCB layer in a multi-layer PCB structure.

Figure 1:
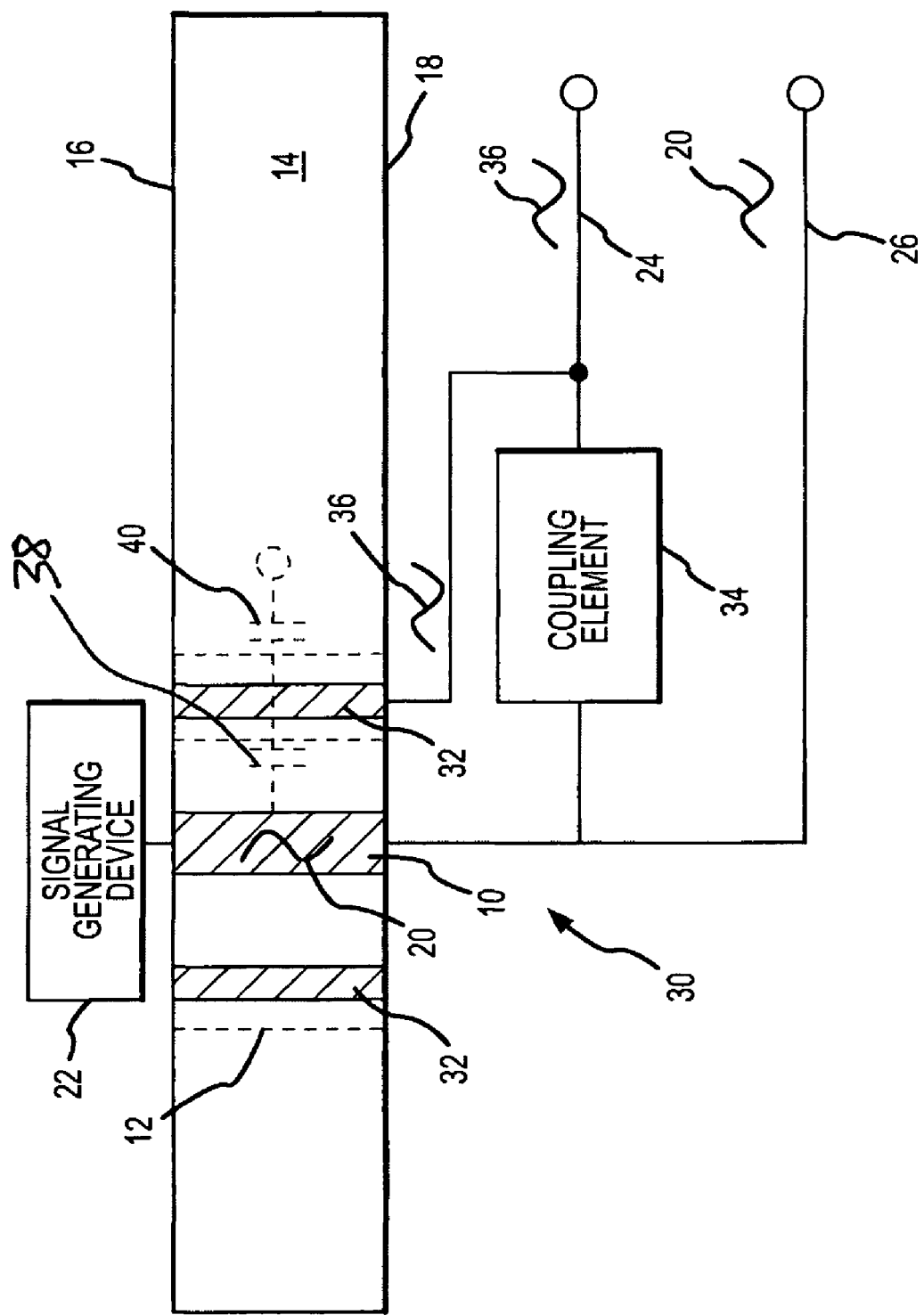
FIG. 1 is a diagram of a shielded through-via in accordance with a present invention.

As shown in FIG. 1, a through-via 10 is formed in an insulating region 12 of a wafer 14 and extends from a front surface 16 to a back surface 18. The through-via carries a signal 20 from a signal generating device 22 from the front surface to the back surface and to a conductive line 24 or 26. Typically, the signal will not include a DC component.

Absent the invention, the time-varying portion of the signal will have to drive a parasitic capacitance formed between through-via 10 and surrounding grounded wafer 14. The parasitic capacitance is an open circuit to any DC voltage, and thus only affects the time-varying portion of the signal including pure AC signals, step functions, transients etc. In practice, the parasitic effect only becomes an issue when trying to sense changes in a capacitance or changes in the charge stored in a capacitor. The loading of the signal increases as the impedance of the signal increases and the impedance of the parasitic capacitance decreases. Advances in both electronic and MEMS technologies are providing signal generating devices such as accelerometers, gyroscopes, and pressure sensors (all varying capacitance) and CCD cameras (varying charge) with capacitances of less than 1 pF and impedances in the 10s of kilo ohms to giga ohm ranges for typical operating frequencies. Conversely the parasitic capacitance increases with circuit densities, which coupled with measurement frequencies in the MHz range yields parasitic impedances that are sufficiently small to measurably load the signal. Loading decreases sensitivity, increases power consumption, and complicates thermal dissipation. Furthermore, other electrical signals on the wafer are coupled more efficiently through the larger parasitic capacitance to the high impedance signal, thereby distorting the signal. Crosstalk reduces the SNR of the signal and makes discrimination of small changes in the signal even more difficult.

To reduce and preferably eliminate the loading and crosstalk effects of parasitic capacitance, a shielded through-via 30 is formed that includes a shield electrode 32 in insulating region 12 around and spaced apart from through-via 10 and a coupling element 34 that couples at least a time-varying portion of signal 20, and possibly the complete signal, as a signal 36 to shield electrode 32. If the signal does include a DC component, the DC component may be removed by placing a high pass filter such as a capacitor on either side of the coupling element 34. Placement of shield electrode 32 close to through-via 10 actually increases parasitic capacitance 38 but because the voltage on the shield electrode tracks the time-varying portion of the signal voltage on the through-via there is ideally no change in the electric field between the shield electrode and through-via, hence no charging of the parasitic capacitance to drain charge from the small capacitance signal 20 as it traverses the through-via. The coupling element preferably has unity gain but a substantial reduction in the effect of the parasitic capacitance can be achieved with a deviation from unity. The coupling element is also preferably characterized by high input impedance so that the coupling element does not load the signal. The input impedance is suitably comparable to the impedance of the signal and preferably higher.

The parasitic capacitance 40 between wafer 14 and now the shield electrode 32 still exists but its direct effect on the through-via is "shielded" by holding the electric field constant around the through-via. This parasitic capacitance can, however, lead to deviations between the through-via and shield electrode voltages. First, other signals could be coupled to the shield electrode and reflected back through the coupling element to the through-via thereby modulating signal voltage 20. Therefore the coupling element preferably isolates its input from its output so that changes in shield electrode voltage 36 do not affect signal voltage 20. Second, the other signals that are coupled to the shield electrode can modulate signal voltage 36. The coupling element preferably has low output impedance that creates a virtual AC ground so that the noise coupled through parasitic capacitance 40 to the shield electrode does not affect the coupled signal. A substantial improvement in the parasitic effect can still be realized if the output impedance is not sufficiently small to prevent loading of signal 36, particularly if the shielded through-via resides in a low noise environment.

An additional benefit of the preferred shielded through-via 30 is that the coupled signal 36 is a virtual replica of at least the time-varying portion of input signal 20 in amplitude, frequency and phase but it has a much lower impedance characteristic. For example, the coupling element may transform the impedance of the signal from 10s of kilo ohms or giga ohms to less than 10 ohms. If the circuit is configured to output coupled signal 36 on conductive line 24 the signal will be far less susceptible to other parasitic capacitances or crosstalk as the signal is routed off the wafer or to another component. The coupling element may induce a small amount of phase delay in the coupled signal. If this is a problem and/or if downstream parasitics or crosstalk are not a problem, the circuit can be configured to output signal 20 from the through-via directly to conductive line 26. In most cases it will be preferable to output the low-impedance signal but both options are available.

Figure 2:
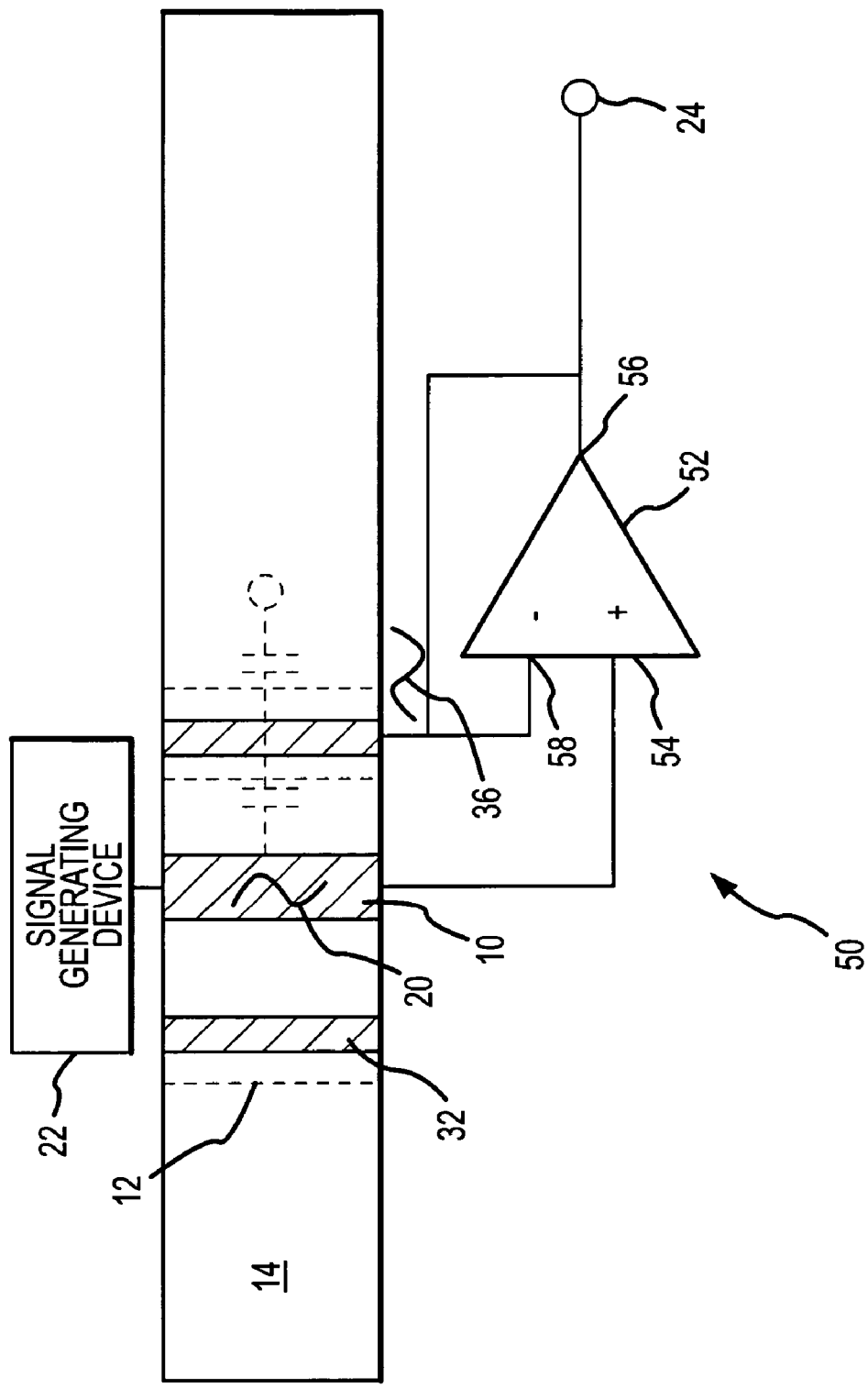
FIG. 2 is a diagram of an embodiment of the shielded through-via.

As shown in FIG. 2, in an exemplary embodiment of the shielded through-via, the coupling element is a buffer 50 comprised of a high-gain operational amplifier 52 with feedback. Input signal 20 is coupled to the non-inverting (+) input 54. Op-amp output 56 is feedback to inverting (−) input 58, which is coupled to shield electrode 32. The buffer provides unity gain over the signal bandwidth, minimal phase delay, isolation, an input impedance comparable to or larger than the impedance of the signal and an output impedance of typically 0.1-1 ohm. The buffered signal 36 applied to shield electrode 32 closely tracks complete signal 20 to effectively hold the electric field between the through-via and the shield electrode at zero. The insertion of a high pass filter such as a capacitor between the through-via and buffer or buffer and shield electrode would filter out any DC portion of the signal thereby coupling only the time-varying portion to the shield electrode. Removing the DC portion of the signal improves sensitivity. The buffer provides the isolation and desired impedance characteristics electrically. These same characteristics could be provided optically by an optical isolator that converts electrical signal 20 to an optical signal and than back to coupled electrical signal 36 or mechanically by a MEMS isolator that converts the electrical signal to a mechanical signal and than back to the coupled electrical signal.

Figure 3:
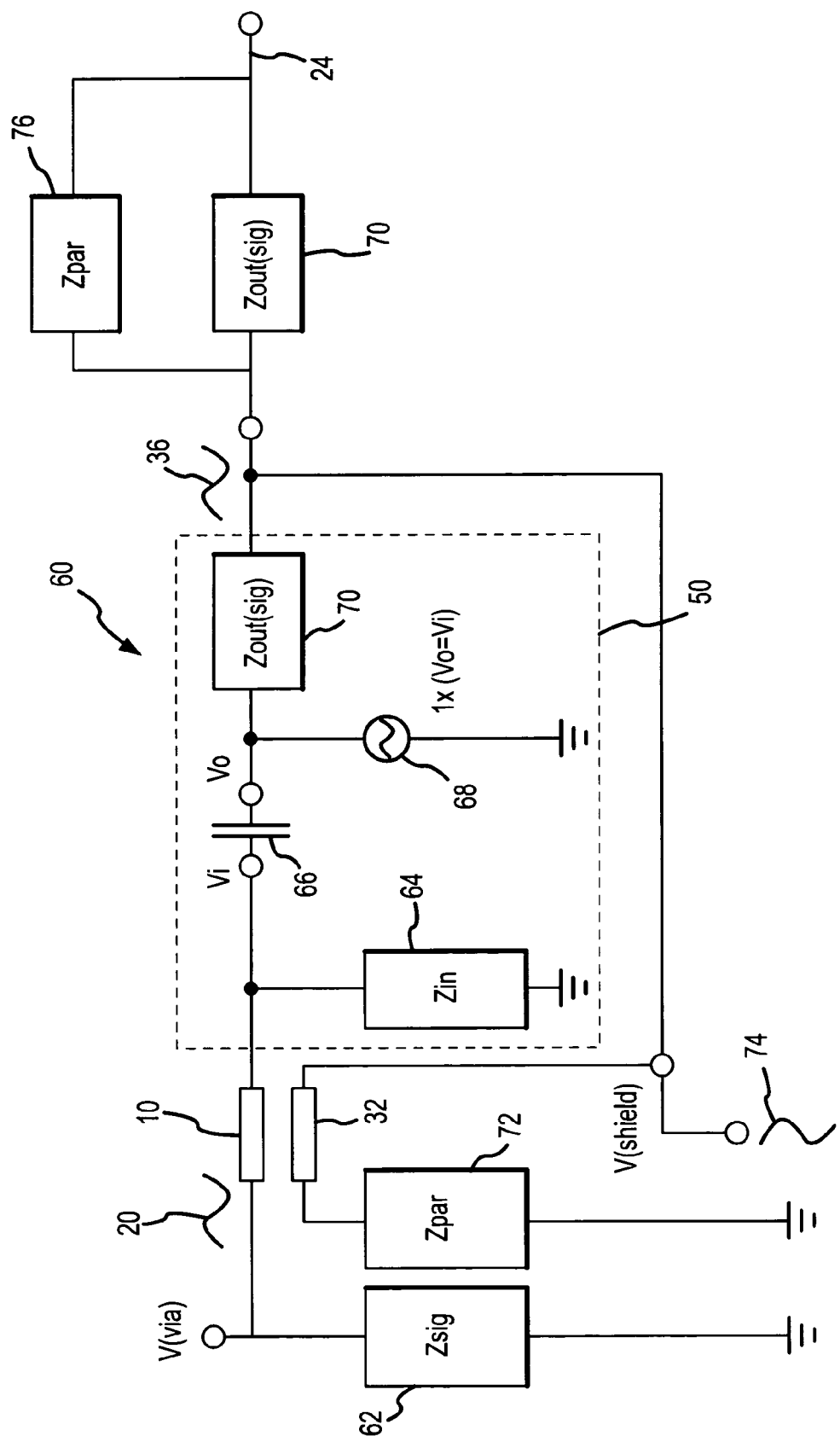
FIG. 3 is a equivalent impedance diagram of the shielded through-via.

Consider the small-signal AC impedance diagram 60 of the shielded through-via as shown in FIG. 3. Signal 20 having impedance Zsig 62 is input from signal generating device 22 shown in FIG. 1 and establishes a time-varying voltage V(via) across through-via 10. The voltage may or may not include a DC component, which has no parasitic effect. The input impedance Zin 64 of the buffer 50 appears in parallel with the impedance Zsig 62 of the signal generating device. Ideally Zin would be infinite but as long as Zin is at least comparable with Zsig and preferably larger, loading of the input signal is usually tolerable. The buffer includes an isolation stage 66 and unity gain stage 68 that replicate signal 20 as signal 36. The buffer's output impedance, hence signal impedance Zout (sig) 70 is very small, typically 0.1-1 ohm.

Buffered signal 36 establishes a voltage V(shield) on shield electrode 32 that tracks the voltage V(via) on the through-via. V(shield) and V(via) are the voltages on either side of parasitic capacitance 38 formed between shield electrode 32 and through-via 10 as shown in FIGS. 1 and 2. Although the impedance Zpar 72 of the parasitic capacitance 38 does not change, the effect of holding the electric field approximately constant, e.g. zero, is to greatly reduce if not eliminate the effect of the parasitic capacitance.

Other electrical signals on neighboring through-vias, traces or in other components, together noise 74 may be coupled back through parasitic capacitance 40 shown in FIG. 1 to the shield electrode 32. The constant electric field and isolation of the buffer prevents these signals from being directly coupled to signal 20 on through-via 10 but they can distort the buffered voltage so that V(shield) does not tightly track V(via). The noise 74 will induce a current through Zout(sig), which will produce a current that will modulate V(shield). If Zout(sig) is very small, less than 10 ohms for example, the voltage modulation will be negligible. If Zout (sig) is larger, the noise may reduce the shielding effect but a substantial improvement will still be realized.

As mentioned previously, a secondary but important benefit provided by the shielded through-via is that buffer signal 36 preferably has low impedance Zout(sig) 70. As the signal travels along conductive line 24 it will see other parasitics Zpar 76. Because signal 36 is no longer actively shielded from these parasitics and other noise sources, the signal's low impedance will minimize the loading and crosstalk effects. For example, the coupling of these parasitics to a 1 or even 10 ohm signal is miniscule compared to the coupling to a 1 mega ohm or gig ohm input signal. In high noise environments, it is more important that the output impedance be low in order to maintain signal quality.

To be effective, shield electrode 32 is preferably configured to present a constant electric field around and coextensive with the length of the through-via. However, similar to coupling element parameters, if for reasons of manufacturing complexity or cost, the shield electrode is configured so that the through-via can 'see' a portion of the wafer a substantial benefit of the shielded through-via can still be achieved. The goal being to configure the shield electrode to cut-off most if not all of the electric field lines between the wafer and the through-via so that the through-via only sees the constant electric field between itself and the shield electrode.

Figure 4A:
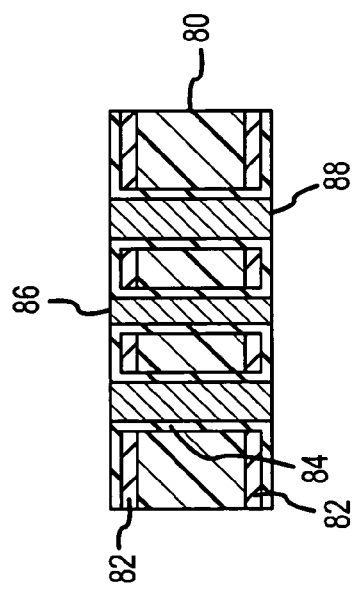
FIGS. 4a and 4b are section views of alternate shielded through-vias.

As shown in FIG. 4a, a processed wafer 80 includes oxide layers 82 on both surfaces and a conformal dielectric coating 84 that defines the insulating region in the wafer, which in this embodiment includes portions of the wafer as well. Conductive through-via 86 extends from the front to the back surface and is insulated from the wafer by dielectric coating 84. Shield electrode 88 is coextensive with the length of through-via 86 and is insulated from both through-via 86 and wafer 80 by the dielectric coating. If the wafer is semi-conductive or conductive, the shield electrode must be insulated from the wafer otherwise the voltage signal would attempt (and fail) to drive the entire wafer and the coupling element could not drive the shield voltage to effectively track the through-via voltage as desired. If the wafer is resistive (or the shielded through-via is formed in an insulating layer such as a thin-film dielectric or PCB), the shield electrode may contact the surrounding wafer or layer.

Figure 4B:
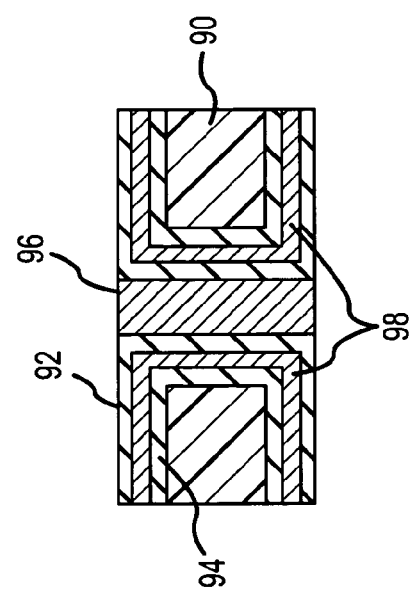

As shown in FIG. 4b, a processed wafer 90 includes conformal dielectric coatings 92 and 94 that separate a through-via 96 from a shield electrode 98 and the shield electrode from the wafer. As described above, if the wafer is conductive or semi-conductive inner dielectric coating 94 is needed to insulate the shield electrode from the wafer. In this embodiment, shield electrode 98 is substantially but not completely coextensive with the length of through-via 96 but shield electrode 98 wraps around the ends of wafer 90 facing the through-via thereby cutting off electric field lines between the wafer and the through-via.

Figure 5A:
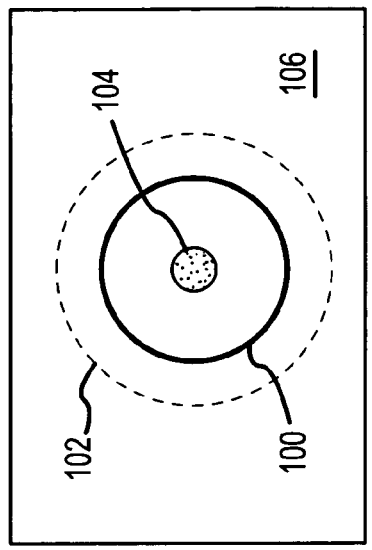
FIGS. 5a and 5b are plan views of different shielded through-vias.
Figure 5B:
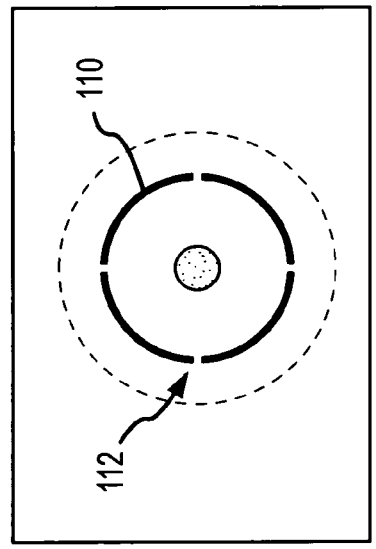

As shown in FIG. 5a, a shield electrode 100 lies in the insulating region 102 around and spaced apart from a through-via 104 and suitably spaced apart from a surrounding wafer 106. As shown, the shield electrode completely circumscribes the through-via so that the through-via cannot see any portion of the wafer. Note, the shield electrode does not have to be circular but can take any shape that adequately shields the through-via from the surrounding wafer. As shown in FIG. 5b, a shield electrode 110 is similarly configured except that it includes a number of small gaps 112. These gaps may be included, for example, to provide a mechanical fixture to support the inner portion of the insulating region around the through-via. The gaps may occur only near the top and/or bottom of the through-via or could extend the length of the through-via. Depending on the size of the gaps and the biasing of the shield electrode, these physical gaps may appear to be much smaller electrical gaps or may not appear at all, i.e. the field lines from the surrounding wafer terminate on the shield electrode and do not penetrate through to the through-via. Even if some of the electric field lines from the wafer penetrate through to the through-via, a substantial benefit can be achieved from the shielded through-via.

The shielded through-vias shown in FIGS. 4a-b and 5a-b as well as other configurations can be fabricated using different process flows. For example, a hole may be etched through the entire length of a wafer, followed by a thin dielectric film deposition to provide an isolation region. A conductive layer is deposited to form the shielding electrode, followed by a second thin dielectric film deposition to provide an isolation region between the shield electrode and the via conductor yet to be formed. Next, a second conductive layer is deposited to form the via conductor, which may be a solid piece as depicted in FIGS. 4 and 5. Alternatively, a hole and coaxial annular outer sections can be etched through the entire length of a wafer, followed by a thin dielectric film deposition to provide isolation regions. A conductive film is deposited in both the hole and the annular outer sections to form the via conductor and the shielding electrode, respectively, as depicted in FIGS. 4a and 5b.

In general the shielded through-via can be used to couple any electrical signal from one side of a layer to another. The signal can be of high or low impedance and can be generated by monolithic circuitry formed in the layer, discrete devices mounted on the layer, devices on another layer, etc. The signal on the backside of the layer can be routed via the conductive line to monolithic or discrete circuitry on the layer itself, to circuitry on another wafer in a stack or off of the layer. The layer can be a processed wafer formed of conductive, semi-conductive or resistive materials. Alternately, the layer can be an insulating material as would be found in a printed circuit board (PCB) or a passivation stack on a wafer where the stack includes the interconnections for the monolithic circuitry.

Figure 6:
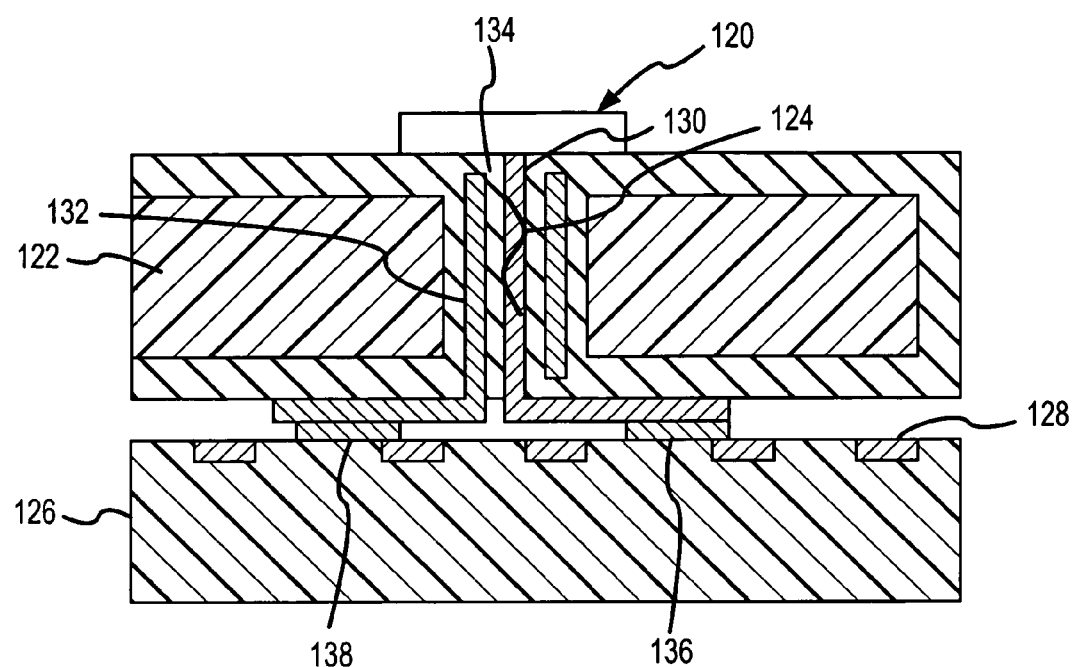
FIG. 6 is a section view of a wafer formed with a shielded through-via to connect a MEMS sensor to an underlying IC wafer.

Although the shielded through-via has such general applicability, it is particularly useful to carry high-impedance signals, which are configured to sense small changes in a capacitance or small changes in charge on a small capacitance, between opposing surfaces of a conductive or semi-conductive wafer where the effects of parasitic capacitance on the signal are the greatest. In an exemplary embodiment, as shown in FIG. 6, a MEMS sensor 120 such as accelerometers, gyroscopes and pressure sensors is formed using conventional MEMS processing techniques on the surface of, for example, a silica wafer 122. The MEMS sensor has a capacitance of <1 pF, hence a very large impedance. The sensed signal 124 albeit acceleration, rate or pressure is reflected as a small change in this already small capacitance. Typically, MEMS devices and integrated circuits are not processed on the same wafer much less the same surface of the same wafer. As shown the MEMS wafer 122 is stacked on top of an IC wafer 126 that includes monolithic circuits 128 for processing the sensed signal. In order to sense the small changes in capacitance, it is critical that signal 124 is not affected by loading or crosstalk as it passes through silica wafer 122 along through-via 130. A shield electrode 132 is provided in an insulating region 134 (here a conformal dielectric coating) around the through-via and spaced apart from the through-via and silica wafer. The through-via and shield electrode are bonded to metal contact pads 136 and 138, respectively. The buffer shown in FIG. 2 is implemented in monolithic circuits 128 to couple signal 124 to the shield electrode to reduce the effect of the parasitic capacitance between through-via 130 and silica wafer 122. Effective shielding of the parasitic capacitance can improve detection sensitivity of the MEMS sensor by at least one or two orders of magnitude.

The same or similar shielded through-via can be placed at multiple via sites throughout the wafer to connect other high-impedance devices through to the IC wafer. It is possible that every through-via may be shielded in this manner or only selected vias. Furthermore, the same or similar shielded through-via can be formed in the IC wafer to carry high (or low) impedance signals to its backside.

Figure 7:
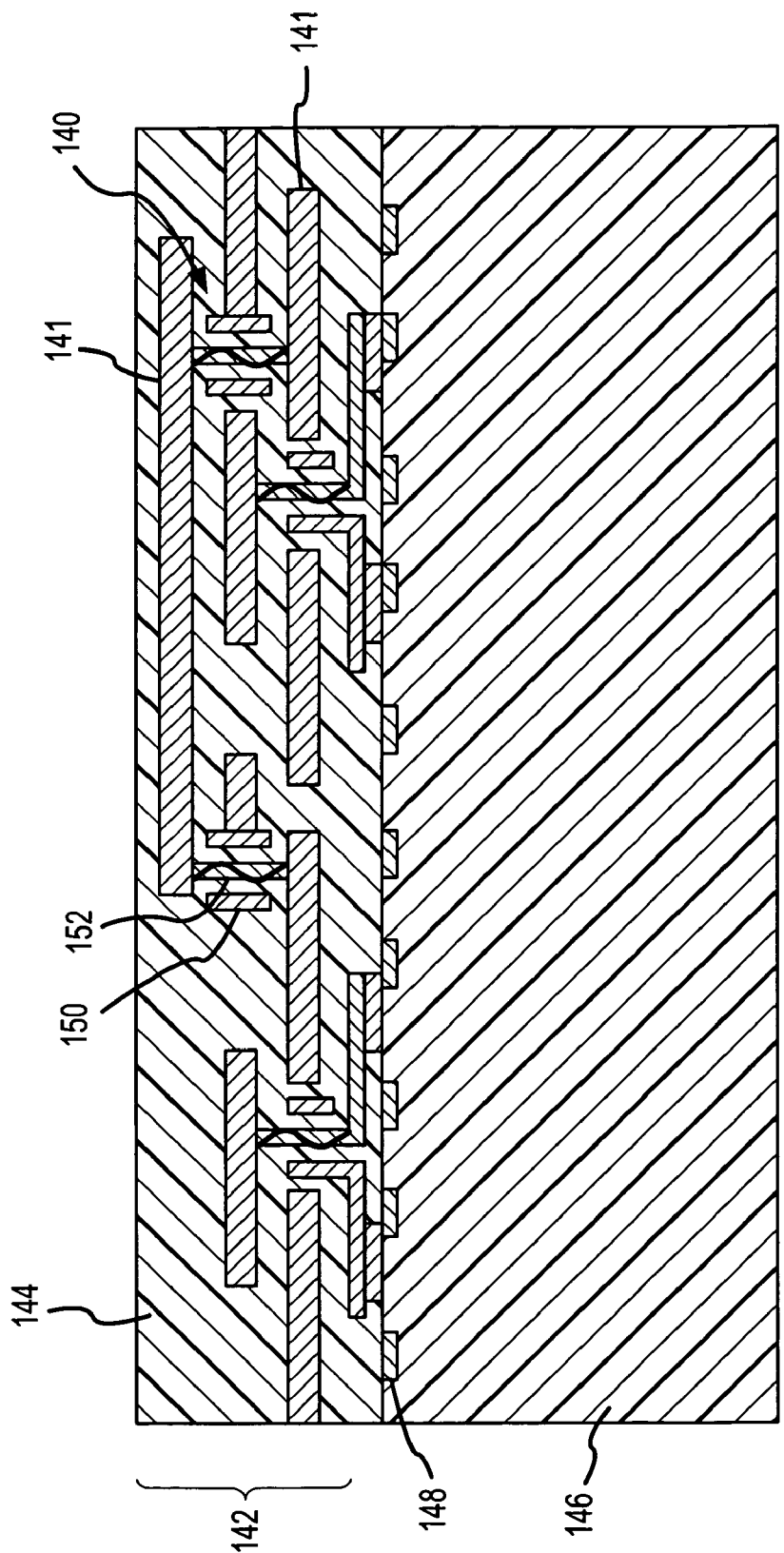
FIG. 7 is a section view of a wafer including a shielded through-via formed in a multi-layer metal interconnect stack.

In another exemplary embodiment, as shown in FIG. 7, shielded through-vias 140 are used to connect metal layers 141 of a multi-layer metal interconnect stack 142 in a thin-film dielectric 144 formed on the surface of a wafer 146 to provide electrical connections for the integrated circuits 148 on the wafer. In this example, the thin-film dielectric 144 layer provides the insulating region so the shield electrode 150 need only be spaced apart from the via 152 and not the surrounding layer 144. Because the layer is itself a dielectric material the effects or parasitic capacitance and isolation are not typically as problematic as with a conductive or semi-conductive wafer. However, as technology advances and the input devices present lower capacitances, e.g. higher impedance, the measurement frequencies increase and circuit densities increase, it may be desirable if not necessary to shield the through-vias.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A shielded through-via, comprising:
    a layer having first and second opposing surfaces and an insulating region there through,
    a conductive through-via having first and second ends in the insulating region configured to receive a signal at its first end and carry the signal from the first surface to the opposing second surface at its second end,
    a shield electrode in the insulating region spaced apart from the through-via, said shield electrode having an unconnected first end and a second end,
    a coupling element having an input connected to the second end of the through-via and an output connected to the second end of the shield electrode, said coupling element coupling at least a time-varying portion of the signal carried on the through-via to the shield electrode, and
    a conductive line connected to one of the second end of the shield electrode and the output of the coupling element to carry the signal.

2. The shielded through-via of claim 1, wherein the coupling element isolotes the signal on the through-via from the signal coupled to the shield electrode.

3. The shielded through-via of claim 1, wherein the coupling element has approximately unity gain.

4. The shielded through-via of claim 1, wherein the coupling element has an output impedance less than ten ohms.

5. The shielded through-via of claim 1, wherein the coupling element has an input impedance comparable to or greater than the signal impedance.

6. The shielded through-via of claim 1, wherein the coupling element is selected from a buffer, an optical isolator or a MEMS isolator.

7. The shielded through-via of claim 1, wherein the coupling element couples at least the time-varying portion of the signal to the shield electrode on the second opposing surface.

8. The shielded through-via of claim 1, wherein said shield electrode is spaced apart from said layer.

9. The shielded through-via of claim 1, wherein the shield electrode circumscribes the through-via and the length of the shield electrode is coextensive with the through-via.

10. The shielded through-via of claim 1, wherein the length of the shield electrode is coextensive with the through-via.

11. The shielded through-via of claim 1, wherein the layer is a semi-conductive or conductive wafer.

12. The shielded through-via of claim 1, wherein the layer is one dielectric layer of a multi-layer metal interconnect stack.

13. The shielded through-via of claim 1, wherein the layer is a printed circuit board.

14. The shielded through-via of claim 1, wherein the layer is one layer of a multilayer printed circuit board.

15. A shielded through-via, comprising:
a wafer of semi-conductive or conductive material having first and second opposing surfaces and an insulating region there through,
a conductive through-via having first and second ends in the insulating region configured to receive a high impedance signal at its first end and carry the signal from the first surface to the second opposing surface at its second end, said conductive through-via having a parasitic capacitance to the surrounding wafer,
a shield electrode in the insulating region around the through-via and spaced apart from the through-via, said shield electrode having an unconnected first end and a second end, and
a unity gain isolator having a non-inverting input connected to the second end of the through-via, an inverting input connected to the second end of the shield electrode and a single-ended output, said isolator transforming at least a time-varying portion of the high impedance signal at its non-inverting input into a low impedance signal at its single-ended output that is connected to the second end of the shield electrode and to a conductive line at the second opposing surface, said coupling of the time-varying portion of the high impedance signal to the shield electrode reducing the effect of the parasitic capacitance to the surrounding wafer.

16. The shielded through-via of claim 15, wherein the unity gain isolator has an output impedance less than ten ohms.

17. The shielded through-via of claim 15, wherein the unity gain isolator has an input impedance comparable to or greater than the high impedance signal.

18. The shielded through-via of claim 15, wherein the unity gain isolator is selected from an electrical buffer, an optical isolator or a MEMS isolator.

19. A shielded through-via circuit, comprising:
a wafer having first and second opposing surfaces and an insulating region there through;
a signal generating device on said wafer, said device generating a time-varying signal indicative of changes in a device capacitance or a charge on the device capacitance;
a conductive through-via having first and second ends in the insulating region configured to receive the time-varying signal at its first end and carry the signal from the first surface to the second opposing surface at its second end;
a shield electrode in the insulating region spaced apart from the through-via, said shield electrode having an unconnected first end and a second end; and
a unity gain isolator having a non-inverting input connected to the second end of the through-via, an inverting input connected to the second end of the shield electrode and a single-ended output that couples the time-varying signal to the second end of the shield electrode and to a conductive line at the second opposing surface.

20. The shielded through-via circuit of claim 19, wherein the unity gain isolator has an output impedance less than ten ohms.

21. The shielded through-via circuit of claim 19, wherein the unity gain isolator has an input impedance comparable to or greater than the time-varying signal.

22. The shielded through-via circuit of claim 19, wherein the unity gain isolator is selected from an electrical buffer, an optical isolator or a MEMS isolator.

* * * * *

UNITED STATES PATENT AND TRADEMARK OFFICE
CERTIFICATE OF CORRECTION

PATENT NO. : 7,589,390 B2  Page 1 of 1
APPLICATION NO. : 11/373223
DATED : September 15, 2009
INVENTOR(S) : Yao It is certified that error appears in the above-identified patent and that said Letters Patent is hereby corrected as shown below:

On Title page of patent, Item (73) please delete assignee "Teledyne Technologies, Incorporated," and insert assignee --Teledyne Licensing, LLC--.

Signed and Sealed this

Eighteenth Day of May, 2010

David J. Kappos
*Director of the United States Patent and Trademark Office*